United States Patent [19]

Gruber et al.

[11] Patent Number: 5,249,150

[45] Date of Patent: Sep. 28, 1993

[54] PROCESS AND CIRCUIT TO DETERMINE ESTIMATES OF THE INSTANTANEOUS VALUE OF PARAMETERS OF AT LEAST ONE SINUSOIDAL SIGNAL WITH CONSTANT AND KNOWN FREQUENCY WHICH IS AN ADDITIVE COMPONENT OF A MEASURING SIGNAL

[75] Inventors: Peter Gruber, Zwillikon; Jürg Tödtli, Zürich, both of Switzerland

[73] Assignee: Landis & Gyr Betriebs AG, Switzerland

[21] Appl. No.: 693,531

[22] Filed: Apr. 30, 1991

[30] Foreign Application Priority Data

May 3, 1990 [CH] Switzerland ............ 01 503/90

[51] Int. Cl.$^5$ ............ G01R 23/00; G06F 3/00; H03H 17/00
[52] U.S. Cl. ............ 364/572; 364/576; 364/574; 364/483; 364/724.01; 364/724.06
[58] Field of Search ........... 364/483, 484, 485, 572, 364/574, 576, 581, 571.02, 724.01, 724.06, 724.08, 551.01; 324/76.21, 76.29

[56] References Cited

U.S. PATENT DOCUMENTS

| | | | |
|---|---|---|---|
| 4,408,284 | 10/1983 | Kijesky et al. | 364/485 |
| 4,471,448 | 9/1984 | Williams | 364/525 |
| 4,604,717 | 8/1986 | Kaplan | 364/569 |
| 4,715,000 | 12/1987 | Premercani | 364/484 |
| 4,812,995 | 4/1989 | Girgis et al. | 364/481 |
| 4,866,736 | 9/1989 | Bergmans | 375/18 |
| 4,878,185 | 10/1989 | Brand et al. | 364/572 |
| 4,901,244 | 2/1990 | Szeto | 364/481 |

FOREIGN PATENT DOCUMENTS 0218220  4/1987  European Pat. Off. .
01238416 9/1989 Japan .

OTHER PUBLICATIONS

Signal Processing IV, Theory and Applications EUSIPCO 88, "A Recursive Estimator for the Determination of Unknown Constant or Slowly Varying Fourier Coefficients", Gruber and Toedli, pp. 1433-1436.

*Primary Examiner*—Jack B. Harvey
*Assistant Examiner*—Brian Buroker
*Attorney, Agent, or Firm*—Meltzer, Lippe, Goldstein, Wolf, Schlissel & Sazer

[57] ABSTRACT

A circuit and method for iteratively estimating Fourier coefficients of one or more Fourier components of a measuring signal utilizes a filter to determine the Fourier coefficients for sampling time $k-1$. The coefficients are utilized to obtain an estimate of the measuring signal at sampling time k. A subtractor circuit subtracts an actual sample of the measuring signal at sampling time k from the estimate of the measuring signal at sampling time k to obtain a difference signal. The difference signal is inputted back into the filter to determine an estimate of the Fourier coefficients at sampling time k.

19 Claims, 2 Drawing Sheets

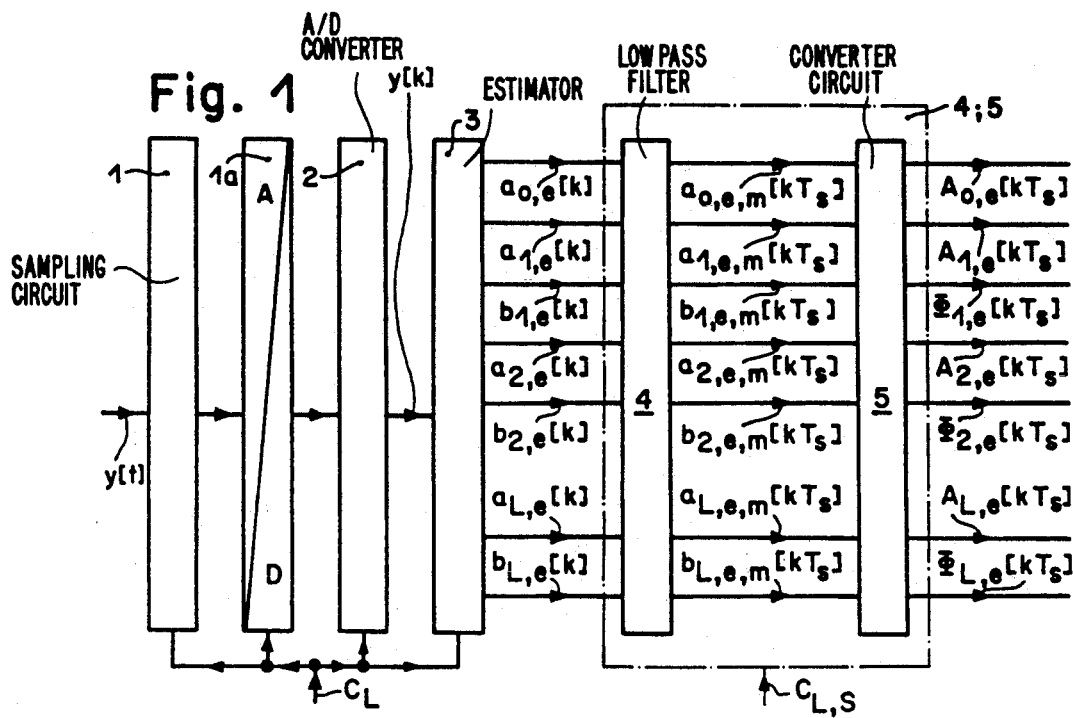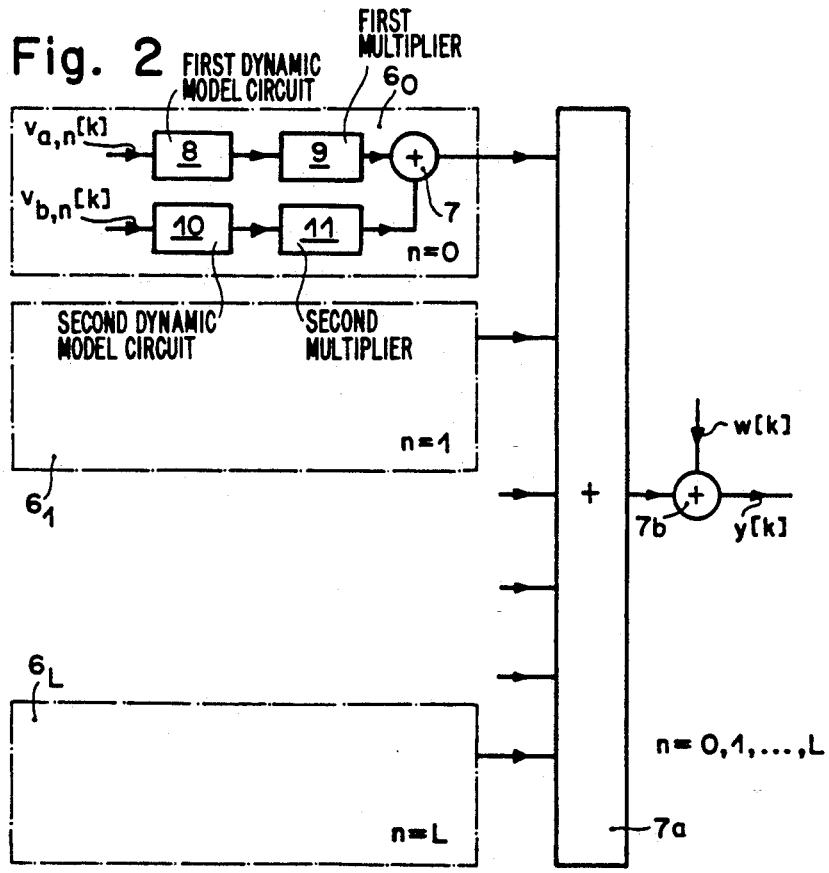

PROCESS AND CIRCUIT TO DETERMINE ESTIMATES OF THE INSTANTANEOUS VALUE OF PARAMETERS OF AT LEAST ONE SINUSOIDAL SIGNAL WITH CONSTANT AND KNOWN FREQUENCY WHICH IS AN ADDITIVE COMPONENT OF A MEASURING SIGNAL

FIELD OF THE INVENTION

The instant invention relates to a process and circuit for determining estimates of the instantaneous values of parameters of at least one sinusoidal signal with constant and known frequency which is an additive component of a measuring signal.

BACKGROUND OF THE INVENTION

Such processes and circuits are advantageously used in message-transmitting equipment and/or in measuring equipment. In such equipment, in addition to each desired signal, at least one sinusoidal interference signal of known frequency is present whose parameter values, i.e. the values of Fourier coefficients or the amplitude and/or phase, are unknown. Thus, it is often desirable to determine such parameters at least by estimation.

The above-mentioned measuring devices are preferably electricity meters and are then used to measure an electric energy or are power measuring devices serving to measure an electric power. Depending on the design variant, values of an electrical active energy and/or of an electrical reactive energy and/or of an electrical apparent energy or values of an electrical active power and/or of an electrical reactive power and/or of an electrical apparent power may be determined by means of the process and/or circuit according to the present invention. Because harmonic signals of a network frequency signal are as a rule also present in an electric utility network in addition to a network frequency signal which has a frequency of 50 Hz or 60 Hz, an appertaining a.c. electricity meter or appertaining a.c. power-measuring device determines not only the energy or power of the network frequency signal but also that of the harmonic signals. In that case, the electricity meter and the power-measuring device each contains a signal designated hereinafter for the sake of simplification as the measuring signal to be evaluated which is equal to the sum of energies or powers of the network frequency signal and of the harmonic signals whose share can be determined at least in part by means of the process according to the instant invention and/or circuit according to the present invention.

In the above-mentioned measuring device it is however also possible to determine, additionally or solely, effective values of currents and/or electric voltages of the network frequency signal and of the harmonic signals by means of the process according to the instant invention and/or circuit according to the instant invention.

The above-mentioned message-transmitting devices are preferably ripple control installations in which information is known to be transmitted over an electric energy utility network by means of a modulated sinusoidal carrier signal. The transmitted information signal is distorted in the electric energy utility network by the network frequency signal of said electric energy utility network at a frequency of 50 Hz or 60 Hz as well as generally also by noise and other signals of a centralized ripple control system. The inventive method and circuit serve for the detection of transmitted ripple control signals. In a ripple control system receiver, the emitted and the transmitted modulated sinusoidal information signal of a ripple control system must then be determined from a measuring signal comprising the sum of the information signal, the sinusoidal network frequency signal, a plurality of sinusoidal harmonic signals of the network frequency signal, the noise and modulated sinusoidal carrier signals of other ripple control system signals all the latter of which are superimposed by addition in form of interference signals on the information signal. The frequencies of the sinusoidal interference signals and of the carrier signal of the information signal are known in advance, while the amplitude and/or phase of the information signal as well as the amplitudes and/or phases of all or part of the interference signal can be determined by means of the process according to the invention and/or the circuit according to the invention.

The process according to the invention and/or the circuit according to the invention can however also be used to determine at the same time signals of ripple control systems and an electrical active and/or reactive and/or apparent power or energy. In all application examples the values of the amplitudes and phases of the sinusoidal signals as well as of a frequently present d.c. voltage component are as a rule a function of time t.

A process of the type mentioned is known from the publication "Signal Processing IV, Theory and Applications, EUSIPCO 88, Grenoble, France, EURASIP, North Holland, A recursive estimator for the determination of unknown constant or slowly varying Fourier coefficients, P. Gruber, J. Toedtli, pages 1433 to 1436". In the process described therein, a sinusoidal signal of known frequency, the amplitude and/or phase of which varies in time, and which is an additive portion of a measuring signal, can be determined in real time, at least by estimation.

It is the object of the instant invention to improve and/or expand the known process significantly so that at least an additional sinusoidal signal of known frequency in the measuring signal, the amplitude and/or phase of which may vary in time, can be determined at least by estimation. This has the advantage, among others, that the values of the amplitudes and/or phases of the sinusoidal signals to be determined as well as the values of a d.c. voltage component to be determined are as a rule more precise.

Because the process according to the instant invention is also able to determine parameters of all the other sinusoidal signals present, at least by estimation, the advantage is especially great in those applications in which more than one sinusoidal signal is to be identified, e.g. a sinusoidal information signal and a sinusoidal interference signal or two sinusoidal interference signals.

Once it is known that a measuring signal comprises M sinusoidal signals all of which have a known, constant and different frequency, and in the case that the possibly varying amplitudes and phases of a plurality of these M sinusoidal signals are to be determined at least by estimation, the process and circuit according to invention supplies more precise values with little additional cost than the process known in the present state of the art if the latter were to be applied separately to each one of the plurality of sinusoidal signals.

SUMMARY OF THE INVENTION

The present invention relates to a process and circuit for determining estimates of the instantaneous values of parameters characteristic of one or more sinusoidal signals of constant and known frequency which are additive components of a measuring signal. In accordance with an illustrative embodiment of the invention, a measuring signal y[t] is sampled to produce instantaneous value y[k], k=0,1,2, ... The values y[k] are converted to digital form by an analog/digital converter and stored in a memory. From the stored samples of the measuring signal, the instantaneous estimated values of the Fourier coefficients $a_{o,e}[k]$, $a_{n,e}[k]$, $b_{n,e}[k]$, where n=1,2,...L, of L,L≧2, desired sinusoidal components of different known frequencies are determined and stored utilizing a filter.

In particular, a digital filter is utilized to determine the Fourier coefficients iteratively. The estimated coefficients $a_{o,e}[k-1]$, $a_{n,e}[k-1]$, $b_{n,e}[k-1]$ are determined using the filter. From these Fourier coefficients, an estimate of the $k^{th}$ sample of the measuring signal $y_e[k]$ is obtained. The difference between $y_e[k]$ and y[k] is then obtained using a subtractor circuit. This difference is utilized by the filter to update the Fourier coefficients, i.e. obtain $a_{o,e}[k]$, $a_{n,e}[k]$, $b_{n,e}[k]$.

A non-linear transformation may be utilized to convert the estimated Fourier coefficients into estimates of the amplitudes and phases of the sinusoidal components.

BRIEF DESCRIPTION OF THE DRAWING

FIG. 1 shows a block diagram of an arrangement to carry out the process according to the invention, FIG. 2 shows a block diagram for the design of an optimal estimator and FIG. 3 shows a block diagram of an estimator.

Identical reference numbers designate identical parts in all the figures of the drawing.

DETAILED DESCRIPTION OF THE INVENTION

Figure 3:
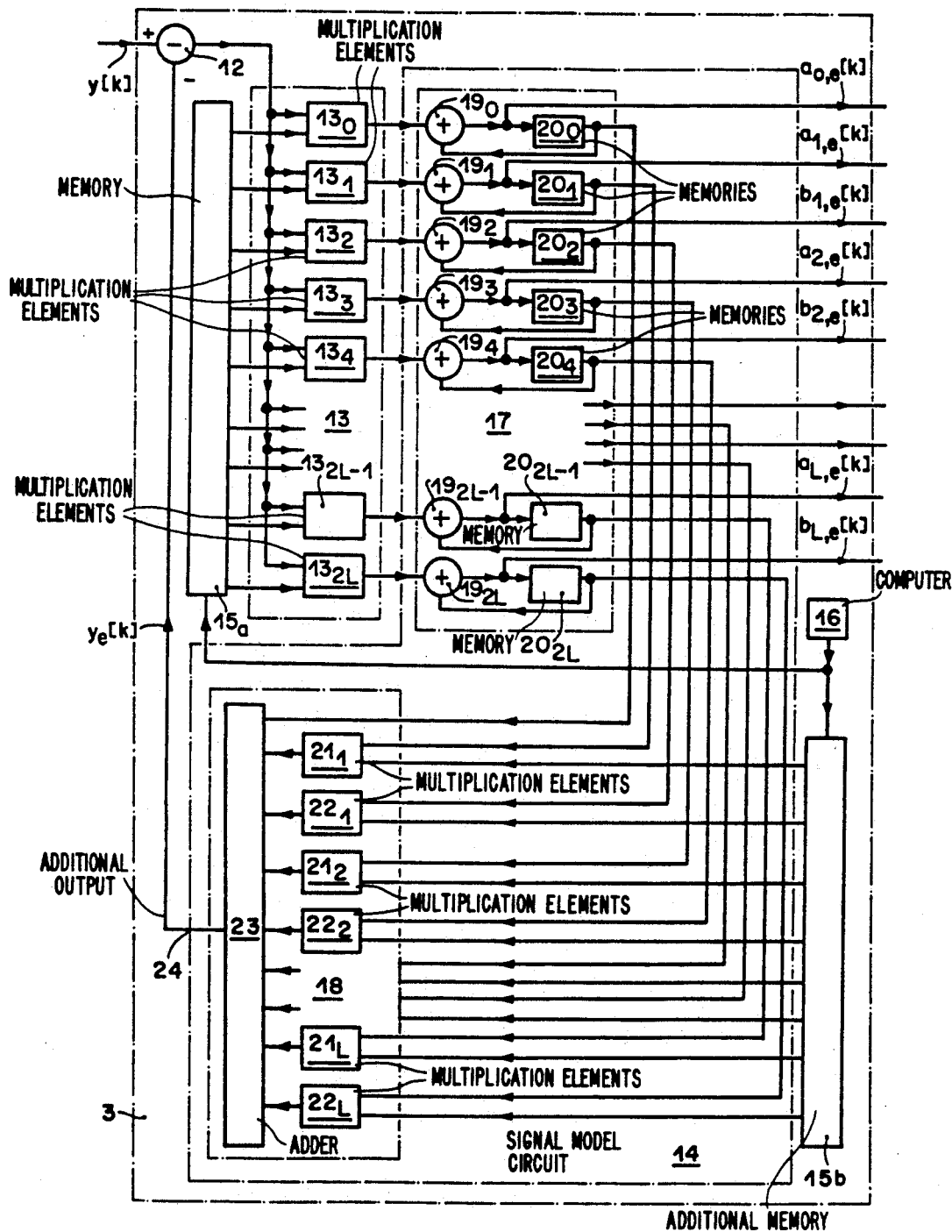

An input of the arrangement shown in FIG. 1 to carry out the process of the invention is fed by a measuring signal y[t] to be evaluated which is a function of time t. The arrangement itself comprises a sampling circuit 1, an analog/digital converter 1a, a memory circuit 2, an estimator 3 and an optional post-processing arrangement 4;5 connected in series in the sequence indicated. The analog/digital converter 1a is thus located between the sampling circuit 1 and the memory circuit 2. With the exception of the post-processing arrangement 4;5, all the components of the arrangement are fed a relatively fast clocking signal $C_L$. The post-processing arrangement 4;5 in turn can be fed the clocking signal $C_L$ or, as indicated in FIG. 1, a slower clocking signal $C_{L,s}$.

The post-processing arrangement 4;5 comprises an optional low pass filter 4 and/or an optional converter circuit 5 which, when both are present, are connected in series in the sequence indicated. If present, the low-pass filter 4 is thus installed downstream of the estimator 3 and, if present, the converter circuit 5 is installed at the output of the arrangement according to the invention.

It is assumed hereinafter that the arrangement according to the invention is implemented digitally and the measuring signal y[t] comprises by addition a "d.c. voltage component" $a_o[t]$;

M periodic sinusoidal components; and a noise signal w[t]

whereby the amplitudes and the phases of the M sinusoidal components as well as of the d.c. voltage component $a_o[t]$ are all variable in time. It is assumed hereinafter that the M sinusoidal components are indicated by an index n and that they start at n=1 and are numbered continuously to n=M.

Signals, the values of which are a sinus or phase-shifted sinus function of time t, are considered as sinusoidal components or signals for purposes of the instant invention. Because from a mathematical point of view the d.c. voltage component $a_o[t]$ is a cosine function of time t the frequency and phase of which are zero and the amplitude $A_o[t]$ of which is equal to the value $a_o[t]$ of the d.c. voltage component, the d.c. voltage component $a_o[t]$ is also a sinusoidal signal for purposes of the invention, and it is hereinafter assigned an index n=0.

The measuring signal y[t] is sampled at discrete points in time $t_k$ by means of the sampling circuit 1 which is present at the input of the arrangement. The sampling is carried out preferably at equally spaced points in time with a constant sampling period T in time, i.e. where $t_k$=kT. The variable k, where k=0,1,2, ... etc. here designates the index of the samples when these, starting at zero, are numbered continuously. The sampling period T is equal to the period of the clocking signal $C_L$.

The sampled analog values $y[t_k]$=y[kT] of the measuring signal y[t] are the measured instantaneous values of the measuring signal y[t] and are designated hereinafter by y[k] for short, the designation [k] standing for the designation [kT]. The measured instantaneous values y[k] are converted in the analog/digital converter 1a into proportional digital values which are then stored in the downstream memory circuit 2 and thereafter reach the input of the estimator 3. The measured instantaneous values y[k] of the measuring signal y[t] are in any case available at the discrete points in time $t_k$ or kT or k.

With n being equal to 1, 2, 3 ... M, the following references designate:

$\Omega_n$: a predetermined constant and time independent frequency of an nth component of the M sinusoidal components, $A_n[k]$: a kth instantaneous value of an amplitude, generally variable in time, of the nth component of the M sinusoidal components, $\phi_n[k]$: a kth instantaneous value of a phase, generally variable in time, of the nth component of the M sinusoidal components, $a_n[k]$: a kth instantaneous value of a first Fourier coefficient $a_n[t]$ of the nth component of the M sinusoidal components, $b_n[k]$: a kth instantaneous value of a second Fourier coefficient $b_n[t]$ of the nth component of the M sinusoidal components, $a_o[k]$: a kth instantaneous value of the d.c. voltage component $a_o[t]$ and w[k]: a kth instantaneous value of the noise signal w[t].

The following equations then apply:

$$a_n[k] = A_n = [k] \cdot \sin\phi_n[k] \quad \text{(II)}$$

$$b_n[k] = A_n[k] \cdot \cos\phi_n[k] \quad \text{(III)}$$

$$y[k] = a_o[k] + \Sigma\{A_n[k] \cdot \sin(\Omega_n \cdot k \cdot T + \Phi_n[k])\} + w[k]$$
$$= a_o[k] + \Sigma\{a_n[k] \cdot \cos(\Omega_n \cdot k \cdot T) + b_n[k] \cdot \sin(\Omega_n \cdot k \cdot T)\} + w[k]$$
(IV)

where $\Sigma\{\ldots\}$ is the sum of the terms $\{\ldots\}$ for all values from n=1 to n=M.

The instantaneous values $a_n[k]$ and $b_n[k]$ of the Fourier coefficients $a_n[t]$ and $b_n[t]$ or the instantaneous values $A_n[k]$ and $\phi_n[k]$ of the amplitude $A_n[t]$ and of phase $\phi_n[t]$ are in that case as a rule unknown parameters varying in time which characterize the nth component of the M sinusoidal components. The instantaneous values $a_o[k]=A_o[k]$ of the Fourier coefficient $a_o[t]$ of the corresponding sinusoidal signal with the index 0 are as a rule also unknown parameters varying in time and designating the d.c. voltage component or the corresponding sinusoidal signal with the index n=0.

The process according to the instant invention now makes it possible to determine instantaneous values $a_o[k]$, $a_n[k]$ and $b_n[k]$ or $A_o[k]$, $A_n[k]$ and $\phi_n[k]$ of the d.c. voltage component $a_o[t]$ and of L components of the M sinusoidal components by estimation, where L is less than or equal to M and at least equal to 1. Without restricting general applicability it is assumed hereinafter that parameters of the L first components of these M sinusoidal components and the parameter $a_o[k]$ of the d.c. voltage component are to be determined so that always at least instantaneous values of the parameters of two sinusoidal signals being sought are to be determined by evaluation if the d.c. voltage component $a_o[t]$ is also treated as a sinusoidal signal. Hereinafter the variable n always possesses the values 1, 2, 3, ..., L.

The process according to the invention now comprises first of all in finding and storing estimated values $a_{o,e}[k]$, $a_{n,e}[k]$ and $b_{n,e}[k]$ of the instantaneous values $a_o[k]$, $a_n[k]$ and $b_n[k]$ of the Fourier coefficients for at least two sought sinusoidal signals with different, previously known frequencies. For that purpose the estimator 3 is provided. The thus-found estimated values $a_{o,e}[k]$, $a_{1,e}[k]$, $a_{2,e}[k]$, ..., $a_{L,e}[k]$, $b_{1,e}[k]$, $b_{2,e}[k]$, ..., $b_{L,e}[k]$ of these Fourier coefficients appear at the output of estimator 3 and thereby at the inputs of the post-processing arrangement 4;5 if present, whereby subscript "e" means "estimated value".

Due to the fact that the estimated values $a_{o,e}[k]$, $a_{n,e}[k]$ and $b_{n,e}[k]$ of the instantaneous values $a_o[k]$, $a_n[k]$ and $b_n[k]$ of the Fourier coefficients may be subject to fluctuations, they are preferably first filtered in the low-pass filter 4 of the post-processing arrangement 4;5 so that only the mean values $a_{o,e,m}[k]$, $a_{1,e,m}[k]$, $a_{2,e,m}[k]$, ..., $a_{L,e,m}[k]$, $b_{1,e,m}[k]$, $b_{2,e,m}[k]$, ..., $b_{L,e,m}[k]$ of the estimated $a_{o,e}[k]$, $a_{1,e}[k]$, $a_{2,e}[k]$, ..., $a_{L,e}[k]$, $b_{1,e}[k]$, $b_{2,e}[k]$, ..., $b_{L,e}[k]$ appear at the output of the low-pass filter 4, whereby the subscript "m" designates the mean value.

If only estimated values $a_{o,e}[k]$, $a_{n,e}[k]$ and $b_{n,e}[k]$ of the instantaneous values $a_o[k]$, $a_n[k]$ and $b_n[k]$ of the Fourier coefficients are sought, the converter circuit 5 is not required and can be omitted. If however the estimated values $A_{n,e}[k]$ and $\phi_{n,e}[k]$ of the instantaneous values $A_n[k]$ and $\phi_n[k]$ of the amplitudes and/or phases of the sinusoidal signals are also sought the converter circuit 5 will be needed.

In the converter circuit 5, depending on the presence or absence of the low-pass filter 4, the estimated values $A_{n,e}[k]$ and/or $\phi_{n,e}[k]$ of the instantaneous values $A_n[k]$ or $\phi_n[k]$ of the amplitudes or phases of the sought L sinusoidal signals as well as the estimated values $A_{o,e}[k]=a_{o,e}[k]$ of the instantaneous values $A_o[k]$ of the amplitude of the sought sinusoidal signal with the index n=0 are determined from the non-filtered or filtered estimated values $a_{o,e}[k]$, $a_{n,e}[k]$ and $b_{n,e}[k]$ or $a_{o,e,m}[kT_s]$ and $b_{n,e,m}[kT_s]$ and $b[kT_s]$ of the instantaneous values $a_o[k]$, $a_n[k]$ and $b_n[k]$ of the Fourier coefficients by means of a non-linear transformation and the equations $$A_{n,e}[k] = \{(a_{n,e,m}[k])^2 + (b_{n,e,m}[k])^2\}^{\frac{1}{2}}$$
(IV)

and $$\phi_{n,e}[k] = arctg\{a_{n,e,m}[k]/b_{n,e,m}[k]\}$$
(V)

If the estimated values at the input of the post-processing arrangement 4;5 appear more rapidly than demanded they can be slowed down in said post-processing arrangement 4;5 by replacing the relatively rapid clocking signal $C_L$ in the post-processing arrangement 4;5 by the slower clocking signal $C_{Ls}$. The post-processing arrangement 4;5 is then fed exclusively the slower clocking signal $C_{Ls}$ as assumed in FIG. 1. The period $T_s$ of the slower clocking signal $C_{Ls}$ is preferably selected so as to be equal to a multiple of T. In that case the mean values $a_{o,e,m}[k]$, $a_{1,e,m}[k]$, $a_{2,e,m}[k]$, ..., $a_{L,e,m}[k]$, $b_{1,e,m}[k]$, ..., $b_{L,e,m}[k]$ of the estimated values appearing at the output of the low-pass filter 4 in whose designations the designation [k] stands for the designation [kT] as mentioned earlier must be replaced by the mean values $a_{o,e,m}[kT_s]$, $a_{1,e,m}[kT_s]$, $a_{2,e,m}[kT_s]$, ..., $a_{L,e,m}[kT_s]$, $b_{1,e,m}[kT_s]$, $b_{2,e,m}[kT_s]$, ..., $b_{L,e,m}[kT_s]$ (see FIG. 1). Starting with the mean values $a_{o,e,m}[kT_s]$, $a_{1,e,m}[kT_s]$ to $a_{L,e,m}[kT_s]$ and $b_{1,e,m}[k]$ to $b_{L,e,m}[k]$ of the estimated values, the sought estimated values $A_{n,e}[kT_s]$ of the amplitudes $A_n[kT_s]$ and $\phi_{n,e}[kT_s]$ of the phases $\phi_n[kT_s]$ of the L sinusoid signals as well as $A_{o,e}[kT_s]=a_{o,e}[kT_s]$ of the terms $a_o[kT_s]$ of the d.c. voltage component which then appear at the output of the converter circuit 5 and thereby at the output of the arrangement according to the invention are determined in the converter circuit 5 by means of a non-linear transformation and the equations $$A_{n,e}[kT_s] = \{(a_{n,e,m}[kT_s])^2 + (b_{n,e,m}[kT_s])^2\}^{\frac{1}{2}}$$
(VI)

and $$\phi_{n,e}[kT_s] = arctg\{a_{n,e,m}[kT_s]/b_{n,e,m}[kT_s]\}$$
(VII).

The estimated values thus determined appear at the output of the converter circuit 5 and thereby also at the output of the arrangement according to the invention.

To be able to determine in time the variations of the estimated values $a_{o,e}[k]$, $a_{n,e}[k]$ and $b_{n,e}[k]$ of the instantaneous values $a_o[k]$, $a_n[k]$ and $b_n[k]$ of the Fourier coefficients, a statistical process is preferably used and it is assumed thereby that the estimated values $a_{o,e}[k]$, $a_{n,e}[k]$ and $b_{n,e}[k]$ are produced by means of a signal model circuit which is shown in FIG. 2. The model allows for a random variation of these estimated values.

The signal model circuit shown in FIG. 2 contains L+1 circuits $6_n$ where n=0, 1, ..., L. All the circuits $6_n$ are of identical construction and each comprises an adder 7, a first dynamic signal model circuit 8, a first multiplier 9, a second dynamic signal model circuit 10 and a second multiplier 11, whereby the output of each of the first dynamic signal model circuits 8 is connected via the first multiplier 9 to a first input of the adder 7 and the output of the second dynamic signal model circuit 10 is connected via the second multiplier 11 to a second input of the adder 7. The multiplication factor of the first multiplier 9 is in each case $\cos(\Omega_n \cdot k \cdot T)$ and that of the second multiplier 11 is $\sin(\Omega_n \cdot k \cdot T)$. One input of the first dynamic signal model circuit 8 of circuit $6_n$ is here fed instantaneous values $v_{a,n}[k]$ of a first noise signal and an input of the second dynamic signal model circuit 10 of the circuit $6_n$ is fed instantaneous values $v_{b,n}[k]$ of a second noise signal, whereby the two noise signals are discrete white Gaussian noise signals independent of each other having a mean value zero and a variance $\sigma^2_{v,n}$. Each one of the outputs of the $L+1$ circuits $6_n$ is connected to an input of an adder $7a$ which is in common to all the circuits $6_n$ and whose output is in turn connected to a first input of an additional adder $7b$. A second input of the additional adder $7b$ is fed instantaneous values $w[k]$ of the noise signal $w[t]$ while the output of the additional adder $7b$ constitutes an output of the signal model at which the instantaneous values $y[k]$ of the measuring signal $y[t]$ appear.

With $n=1,2,\ldots,L$ the following equations of a "random walk" model then apply to the dynamic signal models:

$$a_o[k+1] = a_o[k] + v_{a,o}[k] \quad \text{(VIII)}$$

$$a_n[k+1] = a_n[k] + v_{a,n}[k] \quad \text{(IX)}$$

$$b_n[k+1] = b_n[k] + v_{b,n}[k] \quad \text{(X)}$$

and the equation $$y[k] = a_o[k] + \Sigma\{a_n[k] \cdot \cos(\Omega_n \cdot k \cdot T) + b_n[k] \cdot \sin(\Omega_n \cdot k \cdot T)\} + w[k] \quad \text{(XI)}$$

applies to the instantaneous values $y[k]$ of the measuring signal $y[t]$, where $\Sigma\{\ldots\}$ is this time the sum of the terms $\{\ldots\}$ for all values from $n=1$ to $n=L$.

Assuming that the instantaneous values $w[k]$ of the noise signal $w[t]$ are also white Gaussian noise signals and that its mean value is zero and its variance $\sigma^2_w$, the signal model corresponds to a standard form which can be used to develop an optimal filter for the purpose of determining the estimated values of the parameters $a_n[k]$ and $b_n[k]$ which are considered to be state variables. Such a filter is optimal in the sense that, when the parameters $a_n[k]$ and $b_n[k]$ of the instantaneous values $y[k]$ of the measuring signal $y[t]$ are produced by the signal model, the expected value of the squares of the estimation errors, i.e. of the difference between the parameters $a_n[k]$ and $b_n[k]$ and their estimated values $a_{n,e}[k]$ or $b_{n,e}[k]$ is minimal. The coefficients of the optimal filter are only dependent on the variances $\sigma^2_{v,n}$ and $\sigma^2_w$ and may be calculated offline, e.g. in advance, and be stored in a memory, e.g. a ROM, PROM or RAM. If the parameters $a_n[k]$ and $b_n[k]$ of the instantaneous values $y[k]$ of the measured value $y[t]$ are not precisely in accordance with the assumed signal model, the developed filter is no longer optimal but can be regarded as an optimal filter in an approximation.

The filter which is optimal in the above indicated sense is preferably a Kalman filter developed with a "Random walk" model. The estimator 3 of FIG. 1 is in that case preferably given the construction shown in FIG. 3 and comprises a subtractor 12, an arrangement 13 to generate correction steps and a signal model circuit 14 connected in series in the sequence indicated.

The arrangement 13 contains a multiplication element $13_o$ which has a multiplication coefficient $K_o[k]$ as well as two multiplication elements $13_{2n-1}$ and $13_{2n}$ per value of $n = 1,2,3, \ldots, L$, each with a multiplication coefficient $K_{2n-1}[k]$ or $K_{2n}[k]$. The multiplication coefficients $K_o[k]$, $K_{2n-1}[k]$ and $K_{2n}[k]$ represent filter coefficients of the Kalman filter and serve to weight the input signals of the multiplication elements $13_o$, $13_{2n-1}$ and $13_{2n}$. The multiplication coefficients are variable in time and periodic after the termination of a transient phase. Experiments have shown that the multiplication coefficients have the following form in the case that the frequency of a monomode signal and its harmonic signals are designated by $\Omega_n$:

$$K_o[k] = B_o \quad \text{(XII)}$$

$$K_{2n}[k] = B_n \cdot \sin(\Omega_n kT + \Theta_{2n}) \quad \text{(XIII)}$$

$$K_{2k-1}[k] = B_n \cdot \sin(\Omega_n kT + \Theta_{2n-1}) \quad \text{(XIV)}$$

where $n = 1,2,\ldots,L$ and $\Theta_{2n}$ and $\Theta_{2n-1}$ represent phase angles.

Discrete instantaneous values of these multiplication coefficients $K_o[k]$, $K_{2n-1}[k]$ and $K_{2n}[k]$ can here, as has already been indicated, be calculated off-line in advance and be stored in the digital estimator 3 in a memory $15a$ from which they are retrieved at the right instant preferably by means of a computer 16, which can be a microcomputer, to be stored in form of multiplication coefficients in the appertaining multiplication element $13_o$, $13_{2n-1}$ or $13_{2n}$. For that purpose data outputs of the memory $15a$ are connected to first inputs of the multiplication elements $13_o$, $13_{2n-1}$ or $13_{2n}$. The output $2L+1$ multiplication elements on the other hand constitute $2L+1$ outputs of the arrangement 13 and each is connected to one of $2L+1$ inputs of the signal model circuit 14.

The arrangement 13 comprises a total of $2L+1$ multiplication elements $13_o, 13_1, \ldots, 13_{2L-1}$ and $13_{2L}$, each of which has first and second inputs and one output. The second input of each of the $2L+1$ multiplication elements are connected to each other and form the input of the arrangement 13, which is connected to the output of the subtractor element 12. The outputs of the $2L+1$ multiplication elements form $2L+1$ outputs of the arrangement 13 and are connected to $2L+1$ inputs of the signal model circuit 14.

The signal model circuit 14 utilizes a dynamic signal model originating in the "random walk" [see equations (VIII) to (X)] and preferably comprises a group arrangement 17 of discrete and sequenced integrators called summing integrators as well as an arrangement 18 for the production of "one-step" prediction values $y \cdot [k]$ of the measuring signal $y[t]$ on basis of measuring the measuring signal $y[t]$ up to the point in time $k - 1$.

The group arrangement 17 contains $2L+1$ summing integrators $19_o$; $20_o$ to $19_{2L};20_{2L}$, each of which comprises an adder $19_o;19_1, \ldots, 19_{2L-1}$ or $19_{2L}$ and an appertaining downstream memory $20_o, 20_1, \ldots, 20_{2L-1}$ or $20_{2L}$, whereby one of the $2L+1$ summing integrators $19_o;20, 19_1;20_1, \ldots, 19_{2L-1};20_{2L-1}$ or $19_{2L};20_{2L}$ in the arrangement 17 is assigned to each of the $2L+1$ multiplication elements $13_o$ to $13_{2L}$ in the arrangement 13. The arrangement 17 thereby contains a total of $2L+1$ adders $19_o$ to $19_{2L}$ and $2L+1$ memories $20_o$ to $20_{2L}$. In each summing integrator $19_0;20_0$, $19_1;20_1$, ..., $19_{2L-1};20_{2L-1}$, $;19_{2L};20_{2L}$ its input, which is also one of the 2L+1 inputs of the group arrangement 17, is constituted by a first input of the appertaining adder $19_0,19_1$, ..., $19_{2L-1}$ or $19_{2L}$, the output of which is connected via the appertaining memory $20_0,20_1$, ..., $20_{2L-1}$ or $20_{2L}$ to an output of the summing integrator $19_0;20_0$, $19_1;20_1$, ..., $19_{2L-1};20_{2L-1}$ or $19_{2L};20_{2L}$ which is at the same time an output of a first group of 2L+1 outputs of the group arrangement 17. The output of each of the memories $20_0$ to $20_{2L}$ is furthermore connected to a second input of the appertaining adder $19_0$, $19_1$, ... $19_{2L-1}$ or $19_{2L}$. The outputs of the 2L+1 adders $19_0$ to $19_{2L}$ are furthermore also connected to 2L+1 outputs of a second group of 2L+1 outputs of the group arrangement 17 which are at the same time 2L+1 outputs of the signal model circuit 14 and 2L+1 outputs of the estimator 3. The 2L+1 inputs of the group arrangement 17 are at the same time also 2L+1 inputs of the signal model circuit 14. The 2L+1 outputs of the first group of outputs of the group arrangement 17 are each also connected within the signal model circuit 14 to one of 2L+1 inputs of the arrangement 18.

In the arrangement 18, a $\cos(kT\Omega_n)$ multiplication element $21_n$ appertains to each multiplication element $13_{2n-1}$ of the arrangement 13 and to each multiplication element $13_{2n}$ of the arrangement 13 appertains a $\sin(kT\Omega_n)$ multiplication element $22_n$ where n=1,2,3,..., L, whereby the output of each one of these multiplication elements $13_{2n-1}$ or $13_{2n}$ is connected via the appertaining summing integrator of the group arrangement 17 to a first input of the appertaining $\cos(kT\Omega_n)$ or $\sin(kT\Omega_n)$ multiplication element $21_n$ or $22_n$. The multiplication factors of the multiplication elements $21_n$ and $22_n$ are respectively $\cos(kT\Omega_n)$ or $\sin(kT\Omega_n)$ the values of which are preferably stored in form of digital values within a further memory 15b when the estimator 3 is a digital one. The computer 16 then retrieves these digital values at the right moment in order to store them in the appertaining multiplication element $21_n$ or $22_n$. For that purpose data outputs of the additional memory 15b are each connected to second inputs of the $\cos(kT\Omega_n)$ or $\sin(kT\Omega_n)$ multiplication elements $21_n$ or $22_n$. In practice the two memories 15a and 15b preferably constitute together one single memory 15a;15b, which may be a ROM, a PROM or a RAM, for instance. The memories 15a, 15b or 15a;15b and the computer 16 controlling them are preferably contained in the estimator 3. Each of the outputs of the computer 16 are connected to address inputs of the two memories 15a and 15b or of the memory 15a;15b. The output of the memory $20_0$ of the group arrangement 17 and the outputs of all the $\cos(kT\Omega_n)$ and $\sin(kT\Omega_n)$ multiplication elements $21_n$ and $22_n$ are each connected to one of 2L+1 inputs of a common additional adder 23 which is contained in the arrangement 18 and the output of which constitutes an output of the arrangement 18. The output of the arrangement 18 in turn constitutes an additional output 24 of the signal model circuit 14 which is in turn connected to a minus input of the subtractor while the plus input of the latter constitutes an input of the estimator 3.

When the parameters $a_n[k]$ and $b_n[k]$ of the instantaneous values y[k] of the measuring signal y[t] are produced by means of the signal model described by the equations (VIII) to (X), the estimator 3 must realize the following equations where n=1,2,..., L:

$$a_{o,e}[k] = a_{o,e}[k-1] + K_o[k] \cdot (y[k] - y_e[k]) \quad \text{(XV)}$$

$$a_{n,e}[k] = a_{n,e}[k-1] + K_{2n-1}[k] \cdot (y[k] - y_e[k]) \quad \text{(XVI)}$$

$$b_{n,e}[k] = b_{n,e}[k-1] + K_{2n}[k] \cdot (y[k] - y_e[k]) \quad \text{(XVII)}$$

$$y_e[k] = a_{o,e}[k-1] + \Sigma\{a_{n,e}[k-1] \cdot \cos(\Omega_n kT) + b_{n,e}[k-1] \cdot \sin(\Omega_n kT)\} \quad \text{(XVIII)}$$

where $\Sigma$ is the sum of all values from n=1 to n=L.

At the beginning of the process any, and as much as possible probable values of the estimated values $a_{o,e}[k-1]$, $a_{n,e}[k-1]$ and $b_{n,e}[k-1]$, e.g. zero values are stored in the 2L+1 memories $20_0$ to $20_{2L}$.

If the arrangement is of the construction shown in FIGS. 1 and 3, "one-step" prediction values $y_e[k]$ of the measuring signal y[t] are produced in sequence for each value of k in the estimator 3 from instantaneously applicable estimated values $a_{o,e}[k-1]$, $a_{n,e}[k-1]$ and $b_{n,e}[k-1]$ of the Fourier coefficients stored in the memories $20_0$ to $20_{2L}$ via a time-dependent periodic feedback-coupling. Each prediction value $y_e[k]$ is compared in the subtractor 12 with the corresponding measured instantaneous value y[k] of the measuring signal y[t]. A differential signal $y[k] - y_e[k]$ between the measured instantaneous value y[k] and "one-step" prediction value $y_e[k]$ of the measuring signal y[t] is produced therein in sequence for each value of k. In order to calculate the "one-step" prediction values $y_e[k]$ of the measuring signal y[t], the estimated values $a_{o,e}[k-1]$, $a_{n,e}[k-1]$ and $b_{n,e}[k-1]$ of the Fourier coefficients stored in the memories $20_0$ to $20_{2L}$ are multiplied in the arrangement 18 with the sine and cosine functions $\sin(kT\Omega_n)$ and $\cos(kT\Omega_n)$ and are then added up by means of the adder 23. The values, e.g. digital values of these sine and cosine functions have thereby been retrieved by computer 16 from the memory 15b or 15a;15b at the right moment, shortly before and have been stored in the $\sin(kT\Omega_n)$ or $\cos(kT\Omega_n)$ multiplication elements $21_n$ or $22_n$. In that case, the differential signals $y[k] - y_e[k]$ serve to correct step by step the estimated values $a_{o,e}[k-1]$, $a_{n,e}[k-1]$ and $b_{n,e}[k-1]$ of the Fourier coefficients stored in the memories $20_0$ to $20_{2L}$. For that purpose, each of the differential signals $y[k] - y_e[k]$ is first weighted one after the other in the arrangement 13 of the estimator 3 with the time-variable multiplication coefficients $K_o[k]$, $K_{2n-1}[k]$ and $K_{2n}[k]$ in that each differential signal is multiplied by these time-variable multiplication coefficients whose digital values can for instance be stored in memory 15a or 15a;15b to be retrieved by computer 16 from said memory 15a or 15a;15b at the right moment, shortly before it is utilized and stored in the multiplication elements $13_0$ to $13_{2L}$. Newly applicable values of the estimated values $a_{o,e}[k]$, $a_{n,e}[k]$ and $b_{n,e}[k]$ of the Fourier coefficients are then derived one after the other from the weighted differential signals by means of the summing integrators $19_0;20_0$ to $19_{2L};20_{2L}$ and are stored in the memories $20_0$ to $20_{2L}$.

Estimated values $A_{o,e}[kT_s]$, $A_{n,e}[kT_s]$ and $\phi_{n,e}[kT_s]$ of the sampled d.c. voltage component and of the sampled amplitudes and phases of the sinusoid signals are determined from the estimated values $a_{o,e}[k]$, $a_{n,e}[k]$ and $b_{n,e}[k]$ of the instantaneous values $a_o[k]$, $a_n[k]$ and $b_n[k]$ of the Fourier Coefficients derived from the estimator 3. The estimator 3 can also be based on the method of the least squares with exponential fall-off.

The arrangement according to the instant invention can also function in analog operation. In that case the sampling circuit 1 and the analog/digital converter 1a are not present and analog circuits are to be used for the other components.

Finally, the above-described embodiments of the invention are intended to be illustrative only. Numerous alternative embodiments may be devised by those skilled in the art without departing from the spirit and scope of the following claims.

We claim:

1. A process for iteratively determining estimated instantaneous values of Fourier coefficients characteristic of one or more sinusoidal components of constant and known frequency which are additive components of a measuring signal comprising the steps of:

utilizing a filter circuit to output and store first estimated values of the Fourier coefficients of said sinusoidal components at a sampling time $k-1$ utilizing said filter circuit to process said first estimated values to obtain an estimate of said measuring signal for the sampling time k, subtracting by means of a subtracting circuit element the estimate of the measuring signal at sampling time k from an actual sample of the measuring signal at sampling time k to generate a difference signal, inputting said difference signal into said filter circuit, and utilizing said difference signal in said filter circuit to correct the stored first estimated values of the Fourier coefficients for sampling time $k-1$ to obtain instantaneous second estimated values of the Fourier coefficients for sampling time k.

2. The process of claim 1 wherein said filter circuit utilizes a statistical process to correct said Fourier coefficients.

3. The process of claim 1 wherein said filter circuit multiplies said difference signal with a plurality of weighting coefficients to obtain a plurality of weighted difference signals.

4. The process of claim 3 wherein said Fourier coefficients for sampling time k are determined from said plurality of weighted difference signals by means of a plurality of summing integrators.

5. The process of claim 1 wherein said estimated value of the measuring signal for sampling time k is obtained by multiplying in said filter circuit the stored first estimated values of the Fourier coefficients for sampling time $k-1$ with sine and cosine functions and adding the outputs.

6. The process of claim 1 wherein said estimated values of the Fourier coefficients for sampling time k are filtered by a second low-pass filter in communication with said filter circuit.

7. The process of claim 1 wherein estimates of amplitudes and phases of said sinusoidal components are obtained from said Fourier coefficients for the sampling time k.

8. A circuit for iteratively determining estimates of instantaneous values of Fourier coefficients characterizing one or more sinusoidal components of constant and known frequency which are additive components of a measuring signal, said circuit comprising a subtractor for subtracting an estimated sample of the measuring signal from an actual sample of the measuring signal to generate a difference signal for a particular sampling time, a correction circuit connected to an output of said subtractor and comprising multiplier means for multiplying said difference signal for the particular sampling time by a plurality of time variable coefficients, and a signal model circuit connected to said correction circuit and to said subtractor for generating and storing signals representative of updated estimated values of Fourier coefficients of said sinusoidal components by adding the outputs of said correction circuit to previous estimated values of said Fourier coefficients and for producing said estimated sample of said measuring signal for use by said subtractor for a next sampling time by multiplying said updated estimated value of Fourier coefficients by sine and cosine functions and adding the outputs.

9. The estimator circuit of claim 8 wherein said correction circuit is a Kalman filter which utilizes a random walk model.

10. The estimator circuit of claim 8 wherein said correction circuit comprises a plurality of multiplication elements for multiplying said difference signal by a plurality of time variable multiplication coefficients.

11. The estimator circuit of claim 10 wherein said signal model circuit comprises a group of summing integrators.

12. The estimator circuit of claim 11 wherein each summing integrator comprises an adder having a first input connected to a corresponding one of said multiplication elements and a memory connected downstream of the adder, said memories serving to store said estimated Fourier coefficients values, an output of each memory being connected to a second input of the corresponding adder.

13. The estimator circuit of claim 12 wherein said signal model circuit comprises a second set of multiplication elements, and an additional adder connected to the output of said second set of multiplication elements, said additional adder having an output connected to an input of said subtractor for outputting said estimated sample of said measuring signal.

14. The estimator circuit of claim 8 wherein said estimator circuit further comprises a sampling circuit for sampling the actual measuring signal at discrete points in time and a memory circuit for storing the actual samples of the measuring signal obtained by the sampling circuit.

15. The estimator circuit of claim 14 wherein an analog/digital converter is located between said sampling circuit and said memory circuit.

16. The estimator circuit of claim 8 wherein said multiplication coefficients are stored in a memory.

17. The estimator circuit of claim 8 wherein said estimator circuit includes a low pass filter for filtering said estimated Fourier coefficients.

18. The estimator circuit of claim 8 wherein said estimator circuit includes a converter circuit for converting said estimated Fourier coefficients into values representative of the amplitude and phase of the sinusoidal components.

19. An estimation circuit for interatively determining estimated instantaneous values of Fourier coefficients characterizing one or more sinusoidal components of constant and known frequency which are additive components of a measuring signal comprising means for storing first signals representative of the Fourier coefficients of said sinusoidal components at a sampling time $k-1$, first processing means for processing said first signals to obtain an estimate signal corresponding to an estimate of said measuring signal at a sampling time k, means for generating an actual signal corresponding to an actual sample of the measuring signal at the sampling time k, subtractor means for subtracting said estimate signal and actual signal to obtain a difference signal, and second processing means for processing said first signals and said difference signal to correct said first signals to obtain second signals representative of said Fourier coefficients of said sinusoidal components at the sampling time k.

* * * * *